(12) United States Patent
Otsuki et al.

(10) Patent No.: US 10,276,356 B2
(45) Date of Patent: Apr. 30, 2019

(54) COPPER ALLOY SPUTTERING TARGET

(71) Applicant: JX Nippon Mining & Metals Corporation, Tokyo (JP)

(72) Inventors: Tomio Otsuki, Ibaraki (JP); Kenichi Nagata, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 58 days.

(21) Appl. No.: 14/434,779

(22) PCT Filed: Feb. 28, 2014

(86) PCT No.: PCT/JP2014/055064
§ 371 (c)(1),
(2) Date: Apr. 10, 2015

(87) PCT Pub. No.: WO2014/136673
PCT Pub. Date: Sep. 12, 2014

(65) Prior Publication Data
US 2015/0279638 A1    Oct. 1, 2015

(30) Foreign Application Priority Data

Mar. 7, 2013    (JP) .................................. 2013-045838

(51) Int. Cl.
*C22C 1/02* (2006.01)
*C22C 9/05* (2006.01)
(Continued)

(52) U.S. Cl.
CPC ............ *H01J 37/3429* (2013.01); *C22C 1/02* (2013.01); *C22C 9/05* (2013.01); *C22F 1/08* (2013.01);
(Continued)

(58) Field of Classification Search
CPC ........... H01J 37/3429; C22C 1/08; C22F 9/05
See application file for complete search history.

(56) References Cited

U.S. PATENT DOCUMENTS

| | | | |
|---|---|---|---|
| 7,507,304 B2 | 3/2009 | Okabe et al. | |
| 7,740,721 B2 | 6/2010 | Okabe | |

(Continued)

FOREIGN PATENT DOCUMENTS

| | | | |
|---|---|---|---|
| JP | 04013826 A | * | 1/1992 |
| JP | 2002-294437 A | | 10/2002 |

(Continued)

OTHER PUBLICATIONS

Translation to Ishida (JP 04-013826) published Jan. 1992. (Year: 1992).*

*Primary Examiner* — John J Brayton
(74) *Attorney, Agent, or Firm* — Howson & Howson LLP

(57) ABSTRACT

A copper alloy sputtering target having a composition comprising 1.0 to 5.0 at % of Mn, 0.1 to 4.0 at % of Al, and remainder being Cu and unavoidable impurities, wherein a compositional variation in a plane of the sputtering target is within 20%. The present invention provides a copper alloy sputtering target capable of forming a semiconductor element wiring material, particularly a stable and uniform seed layer which is free of aggregation during copper electroplating, and which has superior sputter deposition properties, and a semiconductor element wiring formed using the copper alloy sputtering target.

7 Claims, 2 Drawing Sheets

Cu-1.9at%Mn-0.3at%Al

(51) Int. Cl.
*C22F 1/08* (2006.01)
*C23C 14/34* (2006.01)
*H01J 37/34* (2006.01)
H01L 21/285 (2006.01)
H01L 21/768 (2006.01)

(52) U.S. Cl.
CPC ...... *C23C 14/3414* (2013.01); *H01L 21/2855* (2013.01); *H01L 21/76873* (2013.01)

(56) References Cited

U.S. PATENT DOCUMENTS

| | | |
|---|---|---|
| 8,246,764 B2 | 8/2012 | Okabe et al. |
| 2004/0072009 A1* | 4/2004 | Segal ................ B21C 23/001 428/561 |
| 2009/0140430 A1 | 6/2009 | Okabe et al. |
| 2010/0013096 A1 | 1/2010 | Irumata et al. |
| 2010/0219070 A1 | 9/2010 | Okabe |
| 2011/0163447 A1 | 7/2011 | Fukushima et al. |
| 2011/0192719 A1 | 8/2011 | Maki et al. |
| 2011/0281134 A1 | 11/2011 | Maki et al. |
| 2012/0298506 A1 | 11/2012 | Ivanov et al. |
| 2014/0097084 A1 | 4/2014 | Nagata et al. |
| 2014/0158532 A1 | 6/2014 | Nagata et al. |
| 2014/0284211 A1 | 9/2014 | Nagata et al. |
| 2014/0360869 A1 | 12/2014 | Otsuki et al. |

FOREIGN PATENT DOCUMENTS

| | | | |
|---|---|---|---|
| JP | 2008-311283 A | 12/2008 |
| JP | 2012-211378 A | 11/2012 |
| JP | 2013-014808 A | 1/2013 |
| JP | 2013-253309 A | 12/2013 |

\* cited by examiner 17 measuring points 9 measuring points

Cu-2.1at%Mn-0.5at%Al

Cu-2.0at%Mn-0.8at%Al

Cu-1.9at%Mn-0.3at%Al

Cu-1.6at%Mn-0.2at%Al

COPPER ALLOY SPUTTERING TARGET

BACKGROUND

The present invention relates to a copper alloy sputtering target capable of forming a semiconductor element wiring material, particularly a stable and uniform seed layer which is free of aggregation during copper electroplating, and which has superior sputter deposition properties.

Conventionally, while Al (specific resistance of roughly 3.1 μΩ·cm) has been used as the wiring material of semiconductor devices, pursuant to the miniaturization of wirings, a copper wiring with lower resistance (specific resistance of roughly 1.7 μΩ·cm) has been put into practical application. As the process for forming a copper wiring, generally adopted is the method of forming a diffusion barrier layer made of Ta or TaN on a wiring or a wiring groove, and thereafter electroplating the copper. As the underlayer (seed layer) for performing the electroplating, copper or copper alloy is generally subject to sputter deposition. Conventionally, high purity copper having a purity of 5N to 6N has been produced by performing wet or dry purification to electrolytic copper having a purity level of 4N (excluding gas components) as the crude metal, and this has been used as a sputtering target.

Nevertheless, with a fine wiring in which the copper wiring width is 0.13 μm or less; for instance, 90 nm or 65 nm, and the aspect ratio exceeds 8, the result will be an ultra-thin film in which the thickness of the seed layer is 100 nm or less. When a seed layer is formed using a copper target having a purity of 6N, there is a problem in that aggregation would occur and it is not possible to form a favorable seed layer. Accordingly, it is important to form a uniform underlayer, and when the underlayer becomes aggregated, it is not possible to form a uniform film upon forming a copper film via electroplating. For example, defects such as voids, hillocks, and disconnections are formed in the wiring. Moreover, even if the foregoing defects such as voids are eliminated, since a non-uniform electrodeposited copper structure will be formed at that location, and there is a problem in that the electro migration (EM) resistance will deteriorate. In order to resolve the foregoing problem, it is important to form a stable and uniform seed layer during the copper electroplating, and required is a sputtering target that is optimal for forming a seed layer with superior sputter deposition properties.

Previously, the Applicant proposed a copper alloy sputtering target for forming a semiconductor element wiring, wherein, by adding an appropriate amount of metal elements, the copper alloy sputtering target is able to prevent the generation of defects such as voids, hillocks, and disconnections during copper electroplating, have low specific resistance, and yield electro migration resistance and oxidation resistance (refer to Patent Document 1 and Patent Document 2). While these Patent Documents are able to improve the EM resistance and oxidation resistance since the low resistance properties of copper are not impaired, there was a problem in that a sufficiently uniform film could not be obtained relative to copper wirings which are becoming even finer in recent years.

Note that, while not directly related to the present application, known is a technique of forming a thin film wiring of a semiconductor device by using a copper alloy sputtering target in which various metal elements are added in trace amounts and in which the oxygen content is additionally adjusted (refer to Patent Documents 3 to 5). Nevertheless, none of the foregoing techniques were able to obtain a copper alloy target capable of forming a film having superior uniformity and suitable for semiconductor element wirings which are becoming even finer in recent years.

PRIOR ART DOCUMENT

Patent Document

Patent Document 1: International Publication No. 2004/083482

Patent Document 2: International Publication No. 2008/041535

Patent Document 3: Japanese Patent Application Publication No. 2002-294437

Patent Document 4: Japanese Patent Application Publication No. 2008-311283

Patent Document 5: Japanese Patent Application Publication No. 2010-053445

SUMMARY

An object of the present invention is to provide a copper alloy sputtering target capable of forming a semiconductor element wiring material, particularly a stable and uniform seed layer which is free of aggregation during copper electroplating, and which has superior sputter deposition properties, and a semiconductor element wiring formed using the copper alloy sputtering target.

In order to achieve the foregoing object, as a result of intense study, the present inventors discovered that, by inhibiting the compositional variation and the like in the plane of a copper alloy sputtering target, it is possible to form a stable and uniform seed layer which is able to prevent the generation of defects such as voids, hillocks, and disconnections during copper electroplating, has low specific resistance, and yields electro migration resistance and oxidation resistance.

In order to resolve the foregoing problems, the present invention provides the following invention:

1) A copper alloy sputtering target having a composition comprising 1.0 to 5.0 at % of Mn, 0.1 to 4.0 at % of Al, and remainder being Cu and unavoidable impurities, wherein a compositional variation in a plane of the sputtering target is within 20%;

2) The copper alloy sputtering target according to 1) above, wherein a variation in a crystal grain size in a plane of the sputtering target is 6.0 μm or less;

3) The copper alloy sputtering target according to 1) or 2) above, wherein a variation in conductivity in a plane of the sputtering target is 0.5% IACS or less;

4) The copper alloy sputtering target according to any one of 1) to 3) above, wherein a variation in Vickers hardness in a plane of the sputtering target is 3 Hv or less; and 5) A method of producing a copper alloy sputtering target, wherein raw materials of Cu, Mn and Al are respectively prepared, the raw materials are adjusted to attain an intended alloy composition and thereafter melted and alloyed via an induction melting method under a vacuum atmosphere at a temperature of 1100° C. or higher, the alloyed molten metal is subsequently poured in a mold and thereafter cooled to 300° C. at a cooling rate of 30° C./min or more, a surface layer of the thus obtained ingot is removed, the ingot is thereafter subject to processes of hot forging, hot rolling, cold rolling, and heat treatment to obtain a sputtering target material, and the sputtering target material is additionally machined and processed into a target shape.

The present invention yields a superior effect of being able to obtain a copper alloy sputtering target capable of forming a semiconductor element wiring material, particularly a stable and uniform seed layer which is free of aggregation during copper electroplating, and which has superior sputter deposition properties, and a semiconductor element wiring formed using the copper alloy sputtering target.

DETAILED DESCRIPTION

Figure 1:
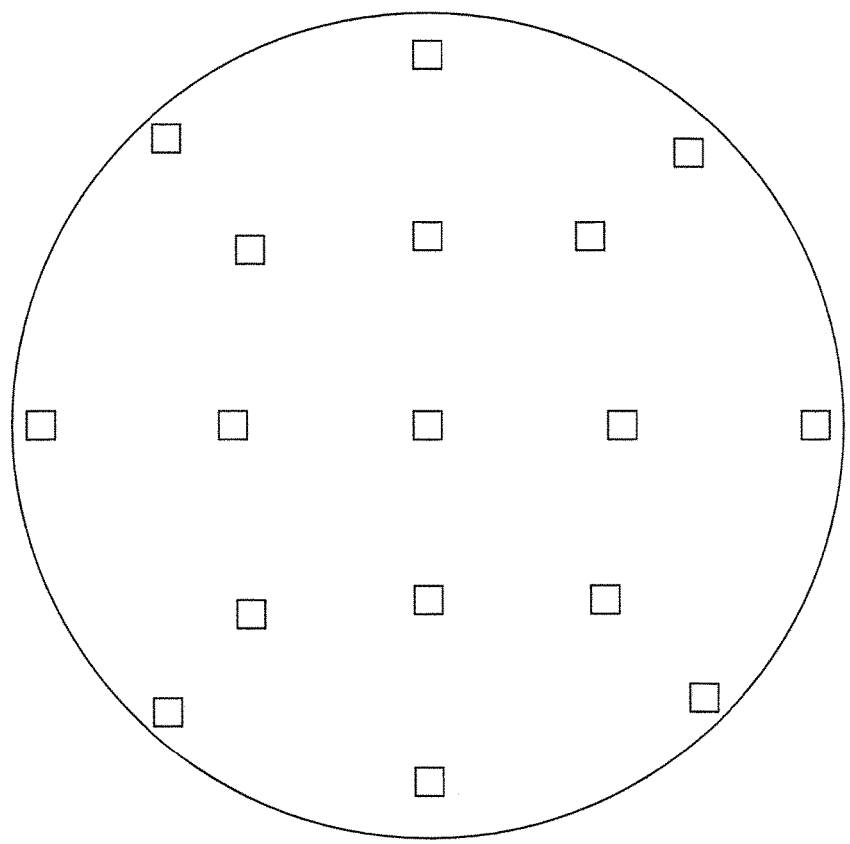
FIG. 1 is a schematic diagram showing the 9 measurement locations or 17 measurement locations in a concentric manner in a planar direction of the target.
Figure 1:
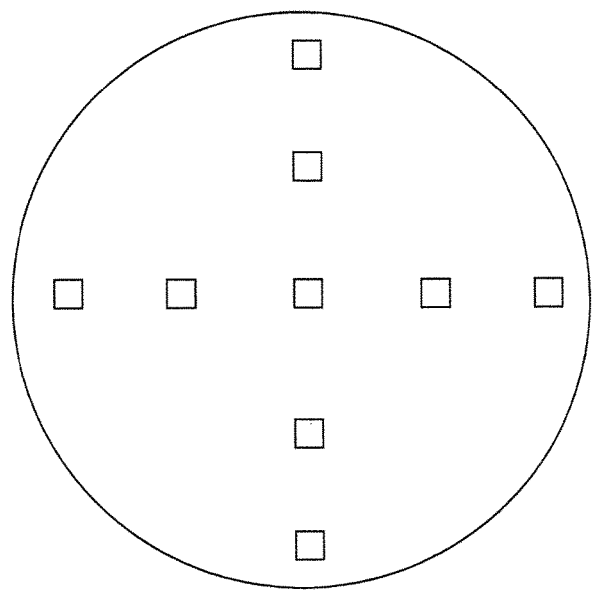
Figure 4:
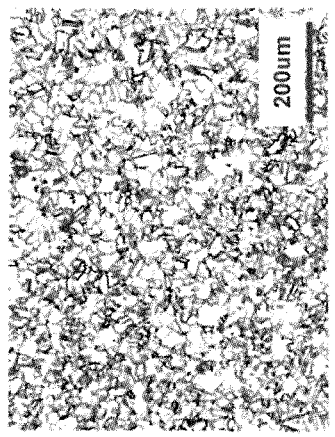
FIG. 4 is an image of the structure of the target of Example 3 when observed with an optical microscope.
Figure 3:
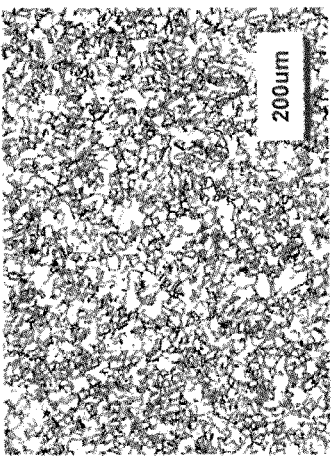
FIG. 3 is an image of the structure of the target of Example 2 when observed with an optical microscope.
Figure 2:
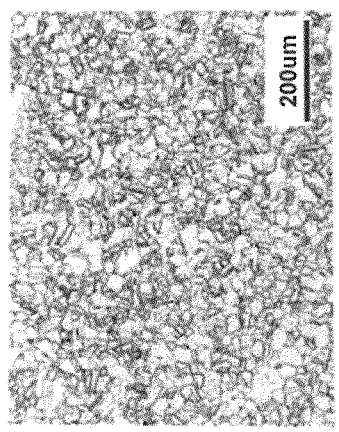
FIG. 2 is an image of the structure of the target of Example 1 when observed with an optical microscope.
Figure 5:
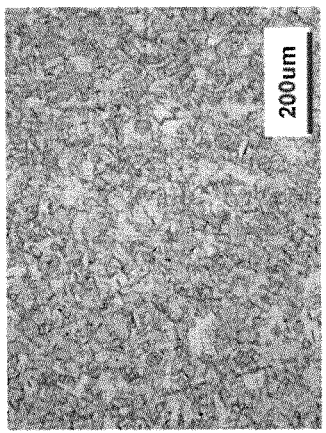
FIG. 5 is an image of the structure of the target of Example 4 when observed with an optical microscope.

The copper alloy sputtering target of the present invention has a composition comprising 1.0 to 5.0 at % of Mn, 0.1 to 4.0 at % of Al, and remainder being Cu and unavoidable impurities. This alloy can effectively prevent aggregation during plating as a result of containing 0.1 to 4.0 at % of Al. In other words, the wettability with the barrier film can be improved.

If the amount of Al is less than 0.1 at %, the effect of preventing aggregation cannot be yielded, and if the amount of Al exceeds 4.0 at %, the resistance in the seed layer will increase, which will lead to the increase in resistance of the overall copper wiring, and this is undesirable. Moreover, since the oxygen content will increase together with the increase of Al during the melting process in the copper alloy production process, the amount of Al exceeding 4.0 at % needs to be avoided.

The present invention can improve the oxidation resistance as a result of containing 1.0 to 5.0 at % of Mn. When the amount of Mn is less than 1.0 at %, the effect of oxidation resistance cannot be yielded, and when the amount of Mn exceeds 5.0 at %, the effect of preventing aggregation will deteriorate; that is, the wettability with the barrier film will deteriorate considerably, and this is undesirable.

A copper alloy sputtering target having this kind of composition is able to form a seed layer which is free from aggregation during copper electroplating and which has high oxidation resistance.

The copper alloy sputtering target of the present invention is unique in that the compositional variation in a plane of the sputtering target is within 20%. Here, the compositional variation can be calculated by measuring the composition at 9 locations or 17 locations in a concentric manner in a planar direction of the target, and using the following formula: {(maximum value of each component content)−(minimum value of each component content)}/(average value of each component content)×100(%). When the thus obtained compositional variation is within 20%, a stable and uniform seed layer can also be formed in an ultra fine wiring, and an even more stable device performance can be expected.

Moreover, the present invention is unique in that a variation in a crystal grain size in a plane of the sputtering target is 6.0 µm or less. Here, the variation in the crystal grain size can be calculated by measuring the crystal grain size at 9 locations or 17 locations in a concentric manner in a planar direction of the target, and using the standard deviation of the measured crystal grain sizes. When the thus obtained variation in the crystal grain size is 6.0 µm or less, the film thickness uniformity of the formed thin film can be considerably improved, and a stable and uniform seed layer can also be formed in an ultra-fine wiring. Note that the average value of the crystal grain size will differ depending on the composition, but it is preferably 100 µm or less.

Moreover, the present invention is unique in that the average conductivity in a plane of the sputtering target is 80% IACS or less, and a variation in conductivity in a plane of the sputtering target is 0.5% IACS or less. Here, the variation in conductivity can be calculated by measuring the conductivity at 9 locations or 17 locations in a concentric manner in a planar direction of the sputtering target, and using the standard deviation of the measured conductivity. When the thus obtained variation in conductivity is 0.5% IACS or less, electrically stable sputtering is enabled, and the film thickness uniformity of the formed thin film can be considerably improved. Note that the average value of conductivity will differ depending on the composition, but it is preferably 80% IACS or less.

Moreover, the present invention is unique in that a variation in Vickers hardness in a plane of the sputtering target is 3 Hv or less. Here, the variation in Vickers hardness can be calculated by measuring the Vickers hardness at 9 locations or 17 locations in a concentric manner in a planar direction of the sputtering target, and using the standard deviation of the measured Vickers hardness. When the thus obtained variation in Vickers hardness is 3 Hv or less, uniform sputter deposition is enabled, and the film thickness uniformity of the formed thin film can be considerably improved. Note that the average value of Vickers hardness will differ depending on the composition, but it is preferably 350 Hv or less.

The copper alloy sputtering target of the present invention can be produced, for instance, based on the following process. Foremost, high purity copper having a purity of 6N or higher, high purity Mn having a purity of 4N or higher, and high purity Al having a purity of 4N or higher are prepared, these raw materials are adjusted to attain an intended alloy composition and thereafter melted and alloyed into a high purity alloy via an induction melting method under a vacuum atmosphere at a temperature of approximately 1100° C. or higher. Subsequently, the alloyed molten metal is poured in a mold to obtain an alloy ingot. What is important here is to increase the cooling rate by appropriately water-cooling (cooling) the mold upon pouring the alloyed molten metal therein. It is thereby possible to cause the composition, crystal grain size, conductivity, strength and the like to be uniform in the ingot. The cooling rate is preferably set to 30° C./min or more up to 300° C. Subsequently, the surface layer of the obtained ingot is removed, and the ingot is subject to processes of hot forging, hot rolling, cold rolling, and heat treatment to obtain a sputtering target material. The obtained sputtering target material is additionally machined and processed into an intended shape, and bonded to a backing plate to produce a target.

EXAMPLES

The present invention is now explained based on the Examples. The Examples indicated below are provided for facilitating the understanding of the present invention, and the present invention is not limited by these Examples. In other words, modifications and other examples based on the technical concept of the present invention are also covered by the present invention as a matter of course.

Example 1

High purity Cu having a purity of 6N or higher, high purity Mn having a purity of 4N or higher, and high purity Al having a purity of 4N or higher were prepared, and these raw materials were introduced into a water-cooled copper crucible and melted at 1250° C. (induction melting method). Subsequently, the alloyed molten metal was poured into a water-cooled mold and cooled to 300° C. at a cooling rate of 30° C./min to obtain a high purity copper alloy ingot having a purity of 5N or higher.

Subsequently, the obtained ingot was processed into a size having a diameter of 180 mm×thickness of 160 mm, thereafter subject to hot forging at 700° C., and additionally subject to cold rolling and rolled to have a diameter of 460 mm×thickness of 24.5 mm. The ingot was subject to heat treatment at 600° C., and rapidly cooled to prepare a rolled plate. The rolled plate was machined into a target having a diameter of 440 mm and thickness of 16.5 mm, bonded with an Al alloy backing plate via diffusion bonding, and subject to finishing processing to obtain a sputtering target assembly.

The crystal grain size, alloy composition, conductivity, and Vickers hardness in a plane of the thus obtained sputtering target were measured. The following measurement method and device were used.

Crystal grain size: Linear analysis (measured area: 480 μm×361 μm)

Compositional analysis: ICP-OES (SPS-3520DD manufactured by Hitachi High-Tech Science Corporation)

Conductivity: Conductivity meter (Auto Sigma 3000 manufactured by GE Inspection Technology)

Moreover, 9 points were measured in a concentric manner in a planar direction of the target. The results are shown in Table 1. The component composition of the target was Cu—1.9 at % Mn—0.3 at % Al, variation in the crystal grain size was 4.30 μm, variation in the alloy composition was Mn 13% and Al 10%, variation in the conductivity was 0.32% IACS, and variation in the Vickers hardness was 2.23 Hv. Thus, the obtained target had superior uniformity in the foregoing points.

Subsequently, using the obtained target, a film was deposited on a Si substrate up to a thickness of approximately 500 nm, and the uniformity of the film was measured. The result was 3.62%, and the film thickness uniformity was superior compared to the Comparative Examples described later, and it was possible to obtain a copper alloy sputtering target capable of forming a stable and uniform seed layer.

TABLE 1

| | Component Composition of Target | Melting Temperature (° C.) | Cooling Rate to 300° C. (° C./min) | Forging Temperature (° C.) | Heat-treatment Temperature (° C.) |
|---|---|---|---|---|---|
| Example 1 | Cu—1.9 at % Mn—0.3 at % Al | 1250 | 30 | 700 | 600 |
| Example 2 | Cu—2.0 at % Mn—0.8 at % Al | 1250 | 50 | 700 | 600 |
| Example 3 | Cu—2.1 at % Mn—0.5 at % Al | 1250 | 50 | 800 | 650 |
| Example 4 | Cu—1.6 at % Mn—0.2 at % Al | 1200 | 30 | 850 | 650 |
| Example 5 | Cu—4.0 at % Mn—3.0 at % Al | 1200 | 30 | 850 | 600 |
| Comarative Example 1 | Cu—1.9 at % Mn—0.3 at % Al | 1250 | 15 | 400 | 600 |
| Comarative Example 2 | Cu—2.0 at % Mn—0.7 at % Al | 1250 | 15 | 700 | 420 |
| Comarative Example 3 | Cu—2.2 at % Mn—0.4 at % Al | 1250 | 15 | 800 | 650 |
| Comarative Example 4 | Cu—1.6 at % Mn—0.2 at % Al | 1200 | 15 | 850 | 650 |
| Comarative Example 5 | Cu—4.0 at % Mn—3.0 at % Al | 1200 | 15 | 900 | 700 |

| | Variation in Grain Size (μm) (Standard Deviation) | Compositional Variation (%) | | Variation in Conductivity (% IACS) | Variation in Hardness (Hv) | Uniformity (%) |
|---|---|---|---|---|---|---|
| | | Mn | Al | | | |
| Example 1 | 4.30 | 13 | 10 | 0.32 | 2.23 | 3.62 |
| Example 2 | 2.24 | 12 | 16 | 0.23 | 1.62 | 3.13 |
| Example 3 | 2.94 | 12 | 13 | 0.36 | 2.03 | 2.99 |
| Example 4 | 5.23 | 10 | 8 | 0.12 | 1.78 | — |
| Example 5 | 2.12 | 18 | 17 | 0.43 | 1.95 | 3.18 |
| Comarative Example 1 | 8.53 | 21 | 24 | 1.64 | 5.64 | 4.85 |
| Comarative Example 2 | 7.15 | 25 | 20 | 1.89 | 8.79 | 6.01 |
| Comarative Example 3 | 9.15 | 24 | 23 | 1.53 | 6.18 | 5.20 |
| Comarative Example 4 | 8.26 | 32 | 26 | 2.05 | 8.37 | — |
| Comarative Example 5 | 6.30 | 28 | 27 | 2.16 | 4.68 | 5.41 |

Example 2

High purity Cu having a purity of 6N or higher, high purity Mn having a purity of 4N or higher, and high purity Al having a purity of 4N or higher were prepared, and these raw materials were introduced into a water-cooled copper crucible and melted at 1250° C. (induction melting method). Subsequently, the alloyed molten metal was poured into a water-cooled mold and cooled to 300° C. at a cooling rate of 50° C./min to obtain a high purity copper alloy ingot having a purity of 5N or higher.

Subsequently, the obtained ingot was processed into a size having a diameter of 180 mm×thickness of 160 mm, thereafter subject to hot forging at 700° C., and additionally subject to cold rolling and rolled to have a diameter of 460 mm×thickness of 24.5 mm. The ingot was subject to heat treatment at 600° C., and rapidly cooled to prepare a rolled plate. The rolled plate was machined into a target having a diameter of 440 mm and thickness of 16.5 mm, bonded with an Al alloy backing plate via diffusion bonding, and subject to finishing processing to obtain a sputtering target assembly.

The crystal grain size, alloy composition, conductivity, and Vickers hardness in a plane of the thus obtained sputtering target were measured. The various measurement conditions were the same as Example 1. Nine points were measured in a concentric manner in a planar direction of the target. The results are shown in Table 1. The component composition of the target was Cu—2.0 at % Mn—0.8 at % Al, variation in the crystal grain size was 2.24 µm, variation in the alloy composition was Mn 12% and Al 16%, variation in the conductivity was 0.23% IACS, and variation in the Vickers hardness was 1.62 Hv. Thus, the obtained target had superior uniformity in the foregoing points.

Subsequently, using the obtained target, a film was deposited on a Si substrate up to a thickness of approximately 500 nm, and the uniformity of the film was measured. The result was 3.13%, and the film thickness uniformity was superior compared to the Comparative Examples described later, and it was possible to obtain a copper alloy sputtering target capable of forming a stable and uniform seed layer.

Example 3

High purity Cu having a purity of 6N or higher, high purity Mn having a purity of 4N or higher, and high purity Al having a purity of 4N or higher were prepared, and these raw materials were introduced into a water-cooled copper crucible and melted at 1250° C. (induction melting method). Subsequently, the alloyed molten metal was poured into a water-cooled mold and cooled to 300° C. at a cooling rate of 50° C./min to obtain a high purity copper alloy ingot having a purity of 5N or higher.

Subsequently, the obtained ingot was processed into a size having a diameter of 180 mm×thickness of 160 mm, thereafter subject to hot forging at 800° C., and additionally subject to cold rolling and rolled to have a diameter of 460 mm×thickness of 24.5 mm. The ingot was subject to heat treatment at 650° C., and rapidly cooled to prepare a rolled plate. The rolled plate was machined into a target having a diameter of 440 mm and thickness of 16.5 mm, bonded with an Al alloy backing plate via diffusion bonding, and subject to finishing processing to obtain a sputtering target assembly.

The crystal grain size, alloy composition, conductivity, and Vickers hardness in a plane of the thus obtained sputtering target were measured. The various measurement conditions were the same as Example 1. Nine points were measured in a concentric manner in a planar direction of the target. The results are shown in Table 1. The component composition of the target was Cu—2.1 at % Mn—0.5 at % Al, variation in the crystal grain size was 2.94 µm, variation in the alloy composition was Mn 12% and Al 13%, variation in the conductivity was 0.36% IACS, and variation in the Vickers hardness was 2.03 Hv. Thus, the obtained target had superior uniformity in the foregoing points.

Subsequently, using the obtained target, a film was deposited on a Si substrate up to a thickness of approximately 500 nm, and the uniformity of the film was measured. The result was 2.99%, and the film thickness uniformity was superior compared to the Comparative Examples described later, and it was possible to obtain a copper alloy sputtering target capable of forming a stable and uniform seed layer.

Example 4

High purity Cu having a purity of 6N or higher, high purity Mn having a purity of 4N or higher, and high purity Al having a purity of 4N or higher were prepared, and these raw materials were introduced into a water-cooled copper crucible and melted at 1200° C. (induction melting method). Subsequently, the alloyed molten metal was poured into a water-cooled mold and cooled to 300° C. at a cooling rate of 30° C./min to obtain a high purity copper alloy ingot having a purity of 5N or higher.

Subsequently, the obtained ingot was processed into a size having a diameter of 220 mm×thickness of 260 mm, thereafter subject to hot forging at 850° C., and additionally subject to cold rolling and rolled to have a diameter of 870 mm×thickness of 20 mm. The ingot was subject to heat treatment at 650° C., and rapidly cooled to prepare a rolled plate. The rolled plate was machined into a target having a diameter of 850 mm and thickness of 16.5 mm, bonded with an Al alloy backing plate via diffusion bonding, and subject to finishing processing to obtain a sputtering target assembly.

The crystal grain size, alloy composition, conductivity, and Vickers hardness in a plane of the thus obtained sputtering target were measured. The various measurement conditions were the same as Example 1. Seventeen points were measured in a concentric manner in a planar direction of the target. The results are shown in Table 1. The component composition of the target was Cu—1.6 at % Mn—0.2 at % Al, variation in the crystal grain size was 5.23 µm, variation in the alloy composition was Mn 10% and Al 8%, variation in the conductivity was 0.12% IACS, and variation in the Vickers hardness was 1.78 Hv. Thus, the obtained target had superior uniformity in the foregoing points.

Since this target had a large target diameter and could not be mounted on a sputtering device, the uniformity of the film after sputtering could not be evaluated, but since the variation in crystal grain size, compositional variation, variation in conductivity, and variation in Vickers hardness were basically the same as the other Examples, it is anticipated that similar results would be obtained.

Example 5

High purity Cu having a purity of 6N or higher, high purity Mn having a purity of 4N or higher, and high purity Al having a purity of 4N or higher were prepared, and these raw materials were introduced into a water-cooled copper crucible and melted at 1200° C. (induction melting method). Subsequently, the alloyed molten metal was poured into a water-cooled mold and cooled to 300° C. at a cooling rate of 30° C./min to obtain a high purity copper alloy ingot having a purity of 5N or higher.

Subsequently, the obtained ingot was processed into a size having a diameter of 180 mm×thickness of 160 mm, thereafter subject to hot forging at 850° C., and additionally subject to cold rolling and rolled to have a diameter of 460 mm×thickness of 24.5 mm. The ingot was subject to heat treatment at 600° C., and rapidly cooled to prepare a rolled plate. The rolled plate was machined into a target having a diameter of 440 mm and thickness of 16.5 mm, bonded with an Al alloy backing plate via diffusion bonding, and subject to finishing processing to obtain a sputtering target assembly.

The crystal grain size, alloy composition, conductivity, and Vickers hardness in a plane of the thus obtained sputtering target were measured. The various measurement conditions were the same as Example 1. Nine points were measured in a concentric manner in a planar direction of the target. The results are shown in Table 1. The component composition of the target was Cu—4.0 at % Mn—3.0 at % Al, variation in the crystal grain size was 2.12 µm, variation in the alloy composition was Mn 18% and Al 17%, variation in the conductivity was 0.43% IACS, and variation in the Vickers hardness was 1.95 Hv. Thus, the obtained target had superior uniformity in the foregoing points.

Subsequently, using the obtained target, a film was deposited on a Si substrate up to a thickness of approximately 500 nm, and the uniformity of the film was measured. The result was 3.18%, and the film thickness uniformity was superior compared to the Comparative Examples described later, and it was possible to obtain a copper alloy sputtering target capable of forming a stable and uniform seed layer.

Comparative Example 1

High purity Cu having a purity of 6N or higher, high purity Mn having a purity of 4N or higher, and high purity Al having a purity of 4N or higher were prepared, and these raw materials were introduced into a non-water-cooled copper crucible and melted at 1250° C. (induction melting method). Subsequently, the alloyed molten metal was poured into a water-cooled mold and cooled to 300° C. at a cooling rate of 15° C./min to obtain a high purity copper alloy ingot having a purity of 5N or higher. Subsequently, the obtained ingot was processed into a size having a diameter of 180 mm×thickness of 160 mm, thereafter subject to hot forging at 400° C., and additionally subject to cold rolling and rolled to have a diameter of 460 mm×thickness of 24.5 mm. The ingot was subject to heat treatment at 600° C., and rapidly cooled to prepare a rolled plate. The rolled plate was machined into a target having a diameter of 440 mm and thickness of 16.5 mm, bonded with an Al alloy backing plate via diffusion bonding, and subject to finishing processing to obtain a sputtering target assembly.

The crystal grain size, alloy composition, conductivity, and Vickers hardness in a plane of the thus obtained sputtering target were measured. The various measurement conditions were the same as Example 1. Nine points were measured in a concentric manner in a planar direction of the target. The results are shown in Table 1. The component composition of the target was Cu—1.9 at % Mn—0.3 at % Al, variation in the crystal grain size was 8.53 µm, variation in the alloy composition was, Mn 21% and Al 24%, variation in the conductivity was 1.64% IACS, variation in the Vickers hardness was 5.64 Hv, and variation in the foregoing points was large. Thus, the obtained target had inferior uniformity.

Subsequently, using the obtained target, a film was deposited on a Si substrate up to a thickness of approximately 500 nm, and the uniformity of the film was measured. The result was 4.85%, and the film thickness uniformity was inferior compared to the foregoing Examples, and it was not possible to form a uniform seed layer.

Comparative Example 2

High purity Cu having a purity of 6N or higher, high purity Mn having a purity of 4N or higher, and high purity Al having a purity of 4N or higher were prepared, and these raw materials were introduced into a non-water-cooled copper crucible and melted at 1250° C. (induction melting method). Subsequently, the alloyed molten metal was poured into a water-cooled mold and cooled to 300° C. at a cooling rate of 15° C./min to obtain a high purity copper alloy ingot having a purity of 5N or higher. Subsequently, the obtained ingot was processed into a size having a diameter of 180 mm×thickness of 160 mm, thereafter subject to hot forging at 700° C., and additionally subject to cold rolling and rolled to have a diameter of 460 mm×25 thickness of 24.5 mm. The ingot was subject to heat treatment at 420° C., and rapidly cooled to prepare a rolled plate. The rolled plate was machined into a target having a diameter of 440 mm and thickness of 16.5 mm, bonded with an Al alloy backing plate via diffusion bonding, and subject to finishing processing to obtain a sputtering target assembly.

The crystal grain size, alloy composition, conductivity, and Vickers hardness in a plane of the thus obtained sputtering target were measured. The various measurement conditions were the same as Example 1. Nine points were measured in a concentric manner in a planar direction of the target. The results are shown in Table 1. The component composition of the target was Cu—2.0 at % Mn—0.7 at % Al, variation in the crystal grain size was 7.15 µm, variation in the alloy composition was, Mn 25% and Al 20%, variation in the conductivity was 1.89% IACS, variation in the Vickers hardness was 8.79 Hv, and variation in the foregoing points was large. Thus, the obtained target had inferior uniformity.

Subsequently, using the obtained target, a film was deposited on a Si substrate up to a thickness of approximately 500 nm, and the uniformity of the film was measured. The result was 6.01%, and the film thickness uniformity was inferior compared to the foregoing Examples, and it was not possible to form a uniform seed layer.

Comparative Example 3

High purity Cu having a purity of 6N or higher, high purity Mn having a purity of 4N or higher, and high purity Al having a purity of 4N or higher were prepared, and these raw materials were introduced into a non-water-cooled copper crucible and melted at 1250° C. (induction melting method). Subsequently, the alloyed molten metal was poured into a water-cooled mold and cooled to 300° C. at a cooling rate of 15° C./min to obtain a high purity copper alloy ingot having a purity of 5N or higher.

Subsequently, the obtained ingot was processed into a size having a diameter of 180 mm×thickness of 160 mm, thereafter subject to hot forging at 800° C., and additionally subject to cold rolling and rolled to have a diameter of 460 mm×thickness of 24.5 mm. The ingot was subject to heat treatment at 650° C., and rapidly cooled to prepare a rolled plate. The rolled plate was machined into a target having a diameter of 440 mm and thickness of 16.5 mm, bonded with an Al alloy backing plate via diffusion bonding, and subject to finishing processing to obtain a sputtering target assembly.

The crystal grain size, alloy composition, conductivity, and Vickers hardness in a plane of the thus obtained sputtering target were measured. The various measurement conditions were the same as Example 1. Nine points were measured in a concentric manner in a planar direction of the target. The results are shown in Table 1. The component composition of the target was Cu—2.2 at % Mn—0.4 at % Al, variation in the crystal grain size was 9.15 μm, variation in the alloy composition was, Mn 24% and Al 23%, variation in the conductivity was 1.53% IACS, variation in the Vickers hardness was 6.18 Hv, and variation in the foregoing points was large. Thus, the obtained target had inferior uniformity.

Subsequently, using the obtained target, a film was deposited on a Si substrate up to a thickness of approximately 500 nm, and the uniformity of the film was measured. The result was 5.20%, and the film thickness uniformity was inferior compared to the foregoing Examples, and it was not possible to form a uniform seed layer.

Comparative Example 4

High purity Cu having a purity of 6N or higher, high purity Mn having a purity of 4N or higher, and high purity Al having a purity of 4N or higher were prepared, and these raw materials were introduced into a non-water-cooled copper crucible and melted at 1200° C. (induction melting method). Subsequently, the alloyed molten metal was poured into a water-cooled mold and cooled to 300° C. at a cooling rate of 15° C./min to obtain a high purity copper alloy ingot having a purity of 5N or higher. Subsequently, the obtained ingot was processed into a size having a diameter of 220 mm×thickness of 260 mm, thereafter subject to hot forging at 850° C., and additionally subject to cold rolling and rolled to have a diameter of 870 mm×thickness of 20 mm. The ingot was subject to heat treatment at 650° C., and rapidly cooled to prepare a rolled plate. The rolled plate was machined into a target having a diameter of 850 mm and thickness of 16.5 mm, bonded with an Al alloy backing plate via diffusion bonding, and subject to finishing processing to obtain a sputtering target assembly.

The crystal grain size, alloy composition, conductivity, and Vickers hardness in a plane of the thus obtained sputtering target were measured. The various measurement conditions were the same as Example 1. Seventeen points were measured in a concentric manner in a planar direction of the target. The results are shown in Table 1. The component composition of the target was Cu—1.6 at % Mn—0.2 at % Al, variation in the crystal grain size was 8.26 μm, variation in the alloy composition was, Mn 32% and Al 26%, variation in the conductivity was 2.05% IACS, variation in the Vickers hardness was 8.37 Hv, and variation in the foregoing points was large. Thus, the obtained target had inferior uniformity.

Since this target had a large target diameter and could not be mounted on a sputtering device, the uniformity of the film after sputtering was not evaluated.

Comparative Example 5

High purity Cu having a purity of 6N or higher, high purity Mn having a purity of 4N or higher, and high purity Al having a purity of 4N or higher were prepared, and these raw materials were introduced into a non-water-cooled copper crucible and melted at 1200° C. (induction melting method). Subsequently, the alloyed molten metal was poured into a water-cooled mold and cooled to 300° C. at a cooling rate of 15° C./min to obtain a high purity copper alloy ingot having a purity of 5N or higher. Subsequently, the obtained ingot was processed into a size having a diameter of 180 mm×thickness of 160 min, thereafter subject to hot forging at 900° C., and additionally subject to cold rolling and rolled to have a diameter of 460 mm×thickness of 24.5 mm. The ingot was subject to heat treatment at 700° C., and rapidly cooled to prepare a rolled plate. The rolled plate was machined into a target having a diameter of 440 mm and thickness of 16.5 mm, bonded with an Al alloy backing plate via diffusion bonding, and subject to finishing processing to obtain a sputtering target assembly.

The crystal grain size, alloy composition, conductivity, and Vickers hardness in a plane of the thus obtained sputtering target were measured. The various measurement conditions were the same as Example 1. Nine points were measured in a concentric manner in a planar direction of the target. The results are shown in Table 1. The component composition of the target was Cu—4.0 at % Mn—3.0 at % Al, variation in the crystal grain size was 6.30 μm, variation in the alloy composition was, Mn 28% and Al 27%, variation in the conductivity was 2.16% IACS, variation in the Vickers hardness was 4.68 Hv, and variation in the foregoing points was large. Thus, the obtained target had inferior uniformity.

Subsequently, using the obtained target, a film was deposited on a Si substrate up to a thickness of approximately 500 nm, and the uniformity of the film was measured. The result was 5.41%, and the film thickness uniformity was inferior compared to the foregoing Examples, and it was not possible to form a uniform seed layer.

Since the present invention can form a stable and uniform seed layer which is free of aggregation during copper electroplating with a copper alloy sputtering target which has superior sputter deposition properties, the present invention is particularly effective in forming a semiconductor element wiring.

The invention claimed is:

1. A copper alloy sputtering target consisting of Cu, Mn and Al at a composition consisting of 1.0 to 5.0 at % of Mn, 0.1 to 4.0 at % of Al, and remainder being Cu, wherein a compositional variation of each of Mn and Al in a plane of the copper alloy sputtering target is within 20%.

2. The copper alloy sputtering target according to claim 1, wherein a variation in a crystal grain size in a plane of the sputtering target is 6.0 μm or less.

3. The copper alloy sputtering target according to claim 2, wherein a variation in conductivity in a plane of the sputtering target is 0.5% IACS or less.

4. The copper alloy sputtering target according to claim 3, wherein a variation in Vickers hardness in a plane of the sputtering target is 3 Hv or less.

5. A method of producing a copper alloy sputtering target consisting of Cu, Mn and Al, wherein raw materials of Cu, Mn and Al are respectively prepared, the raw materials are adjusted to attain an intended alloy composition and thereafter melted and alloyed via an induction melting method under a vacuum atmosphere at a temperature of 1100° C. or higher, the alloyed molten metal is subsequently poured in a mold and thereafter cooled to 300° C. at a cooling rate of 30° C./min or more, the ingot is thereafter subject to processes of hot forging, hot rolling, cold rolling, and heat treatment to obtain a sputtering target material of a composition consisting of 1.0 to 5.0 at % of Mn, 0.1 to 4.0 at % of Al, and remainder being Cu, and the sputtering target material is additionally machined and processed into a target shape, wherein a compositional variation of each of Mn and Al in a plane of the copper alloy sputtering target is within 20%.

6. The copper alloy sputtering target according to claim 1, wherein a variation in conductivity in a plane of the sputtering target is 0.5% IACS or less.

7. The copper alloy sputtering target according to claim 1, wherein a variation in Vickers hardness in a plane of the sputtering target is 3 Hv or less.

\* \* \* \* \*